(12) United States Patent
Harada et al.

(10) Patent No.: US 9,558,837 B2
(45) Date of Patent: Jan. 31, 2017

(54) NONVOLATILE SEMICONDUCTOR MEMORY DEVICE

(71) Applicant: KABUSHIKI KAISHA TOSHIBA, Minato-ku (JP)

(72) Inventors: Yoshikazu Harada, Kawasaki (JP); Akio Sugahara, Yokohama (JP); Masahiro Yoshihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/862,412

(22) Filed: Sep. 23, 2015

(65) Prior Publication Data

US 2016/0012902 A1 Jan. 14, 2016

Related U.S. Application Data

(63) Continuation of application No. PCT/JP2013/075382, filed on Sep. 12, 2013.

(30) Foreign Application Priority Data

Mar. 25, 2013 (JP) ................................. 2013-062125

(51) Int. Cl.
*G11C 16/10* (2006.01)
*G11C 16/26* (2006.01)
(Continued)

(52) U.S. Cl.
CPC ........... *G11C 16/26* (2013.01); *G11C 11/5628* (2013.01); *G11C 11/5642* (2013.01); *G11C 16/10* (2013.01);
(Continued)

(58) Field of Classification Search
CPC .................................................. G11C 16/3418
(Continued)

(56) References Cited

U.S. PATENT DOCUMENTS 5,687,121 A 11/1997 Lee et al.
6,930,925 B2 * 8/2005 Guo ....................... G11C 16/12
365/185.28
(Continued)

FOREIGN PATENT DOCUMENTS

JP 02-061896 A 3/1990
JP 2004-158094 A 6/2004
(Continued)

OTHER PUBLICATIONS

Office Action issued on Mar. 15, 2016 in Japanese Patent Application No. 2013-062125 with English translation.
(Continued)

*Primary Examiner* — Son Mai
(74) *Attorney, Agent, or Firm* — Oblon, McClelland, Maier & Neustadt, L.L.P.

(57) ABSTRACT

A semiconductor memory device includes a memory cell array, a sense amplifier, a register, a controller. The memory cell array includes a memory cell. The sense amplifier connects to the bit line. The register holds write data, and a write voltage. The controller outputs a busy signal. The controller causes the register to hold the write data and the write voltage upon receiving the first command, and resumes the write operation based on the write data and the write voltage held in the register upon receiving the resumption command.

13 Claims, 8 Drawing Sheets

(51) Int. Cl.
*G11C 11/56* (2006.01)
*G11C 16/34* (2006.01)

(52) U.S. Cl.
CPC ....... *G11C 16/3459* (2013.01); *G11C 16/3418* (2013.01); *G11C 2211/5621* (2013.01)

(58) Field of Classification Search
USPC .......................................................... 365/228
See application file for complete search history.

(56) References Cited

U.S. PATENT DOCUMENTS

| | | | |
|---|---|---|---|
| 7,085,167 B2 * | 8/2006 | Lee | G11C 16/225 365/185.17 |
| 7,586,785 B2 * | 9/2009 | Hosono | G11C 16/10 365/185.12 |
| 7,742,334 B2 | 6/2010 | Fujisawa et al. | |
| 7,852,675 B2 | 12/2010 | Maejima | |
| 8,164,952 B2 | 4/2012 | Yun et al. | |
| 8,372,720 B2 | 2/2013 | Fukuzumi et al. | |
| 8,952,426 B2 | 2/2015 | Maejima | |
| 2011/0284946 A1 | 11/2011 | Kiyotoshi | |
| 2012/0044764 A1 | 2/2012 | Nakai et al. | |
| 2013/0314990 A1 | 11/2013 | Harada et al. | |

FOREIGN PATENT DOCUMENTS

| | | |
|---|---|---|
| JP | 2005-018650 A | 1/2005 |
| JP | 2008-034045 A | 2/2008 |
| JP | 2012-43496 A | 3/2012 |
| JP | 2012-212479 A | 11/2012 |
| JP | 2013-242944 A | 12/2013 |

OTHER PUBLICATIONS

English translation of the International Search Report issued Jan. 20, 2014 in PCT/JP2013/075382 filed Sep. 12, 2013.
English translation of the Written Opinion issued in PCT/JP2013/075382 filed Sep. 12, 2013.
Office Action issued May 1, 2015 in Taiwanese Patent Application No. 102130686, with English translation.
Combined Office Action and Search Report issued Aug. 20, 2015 in Taiwanese Patent Application No. 102130686 (with English language translation and English translation of Category of Cited Documents).

* cited by examiner

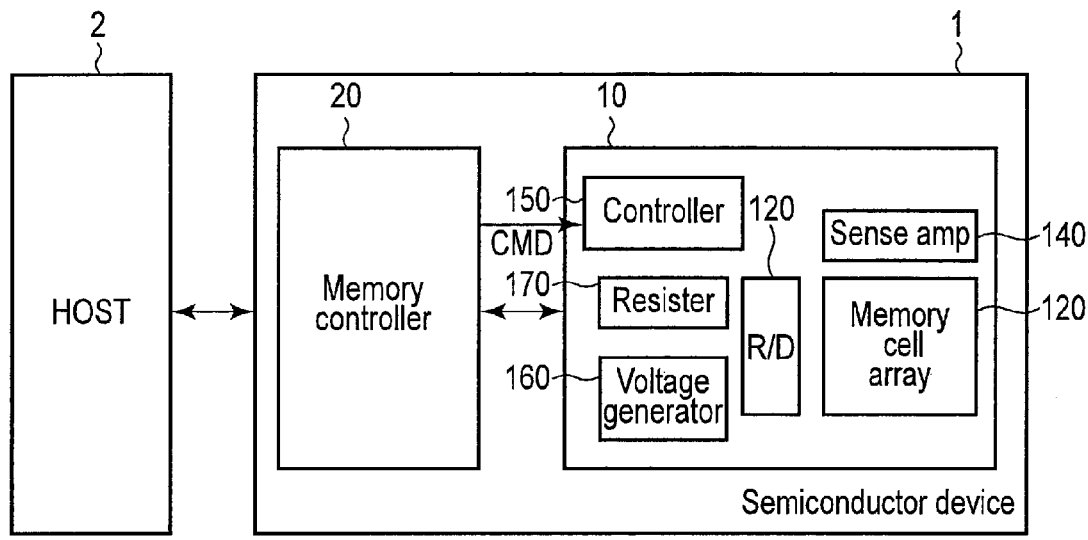
F I G. 1
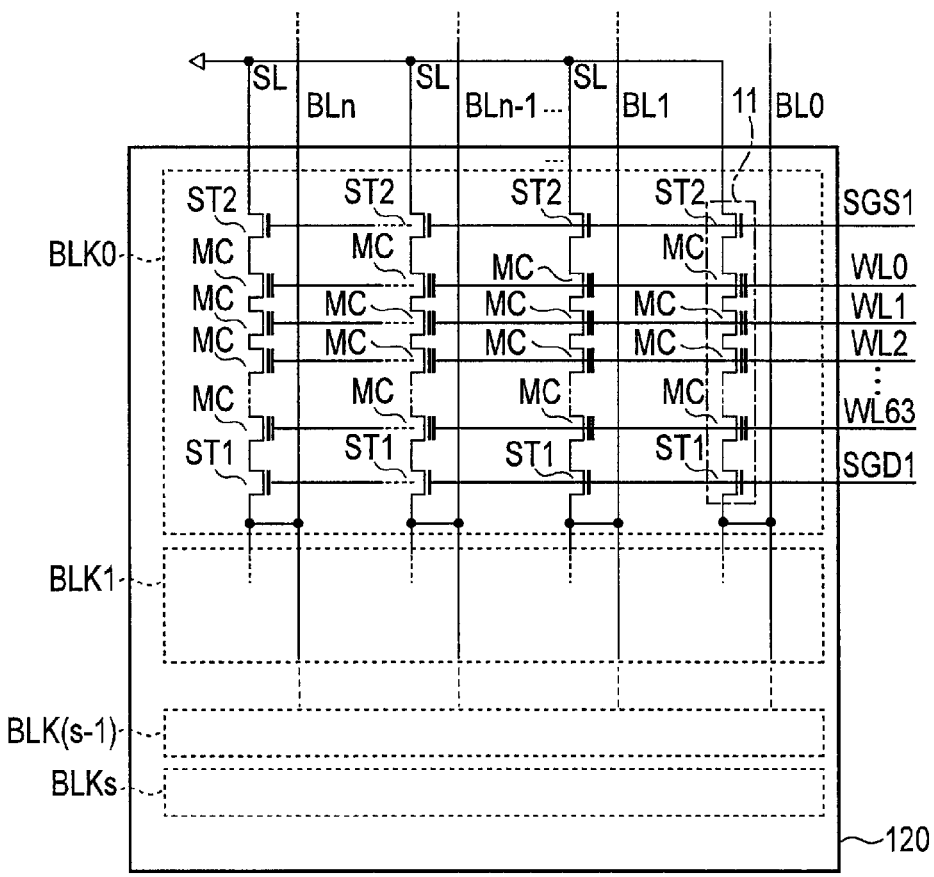
F I G. 2

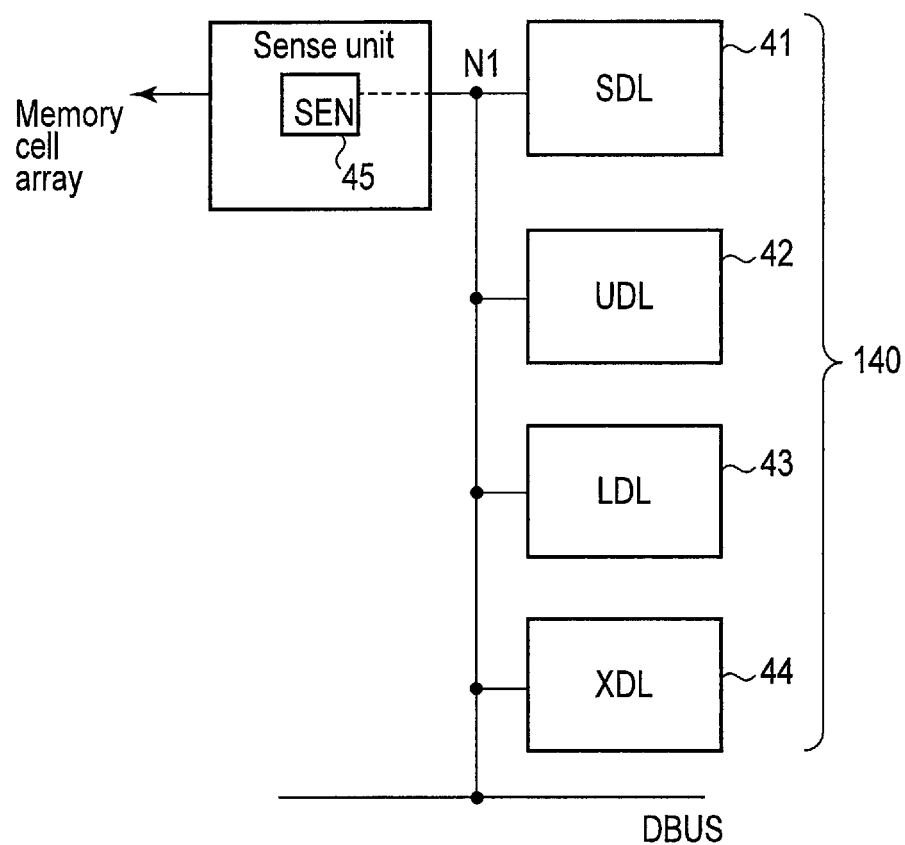
F I G. 3

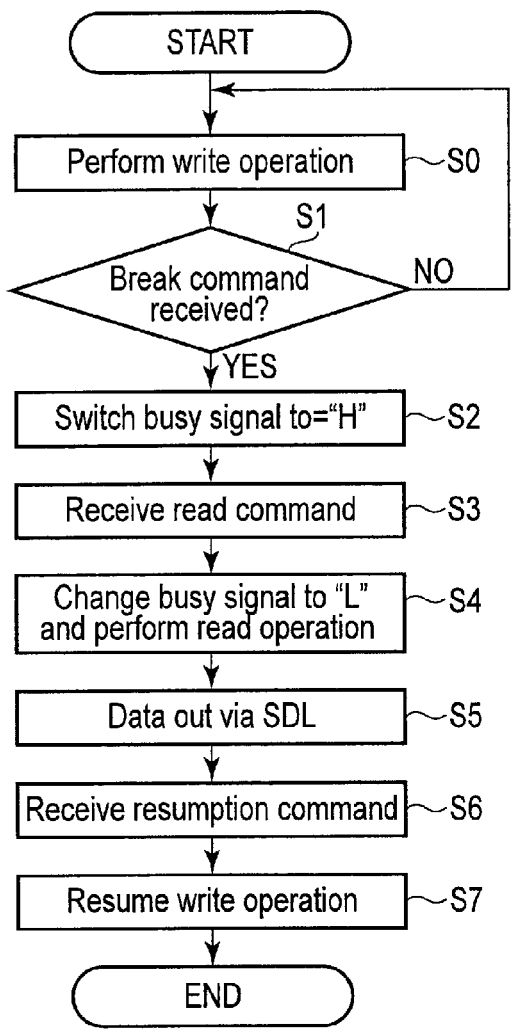
F I G. 4A
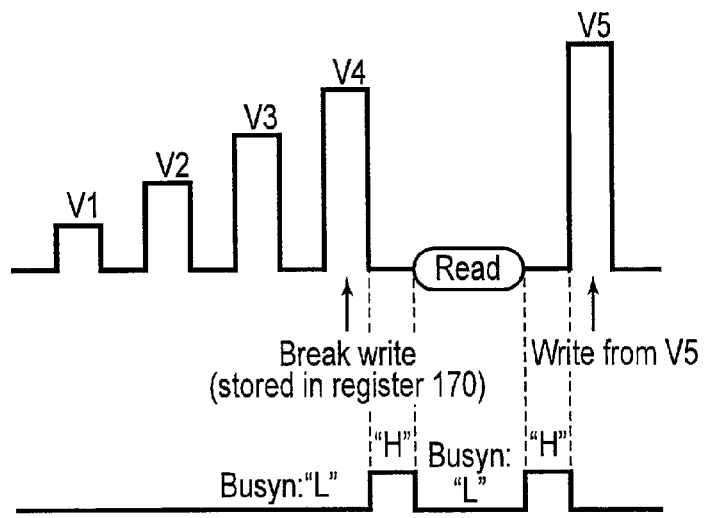
F I G. 4B

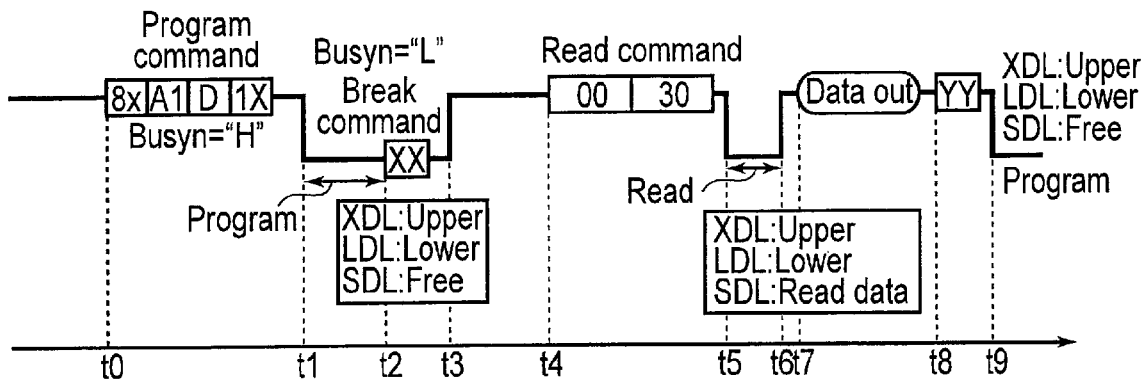
F I G. 5A
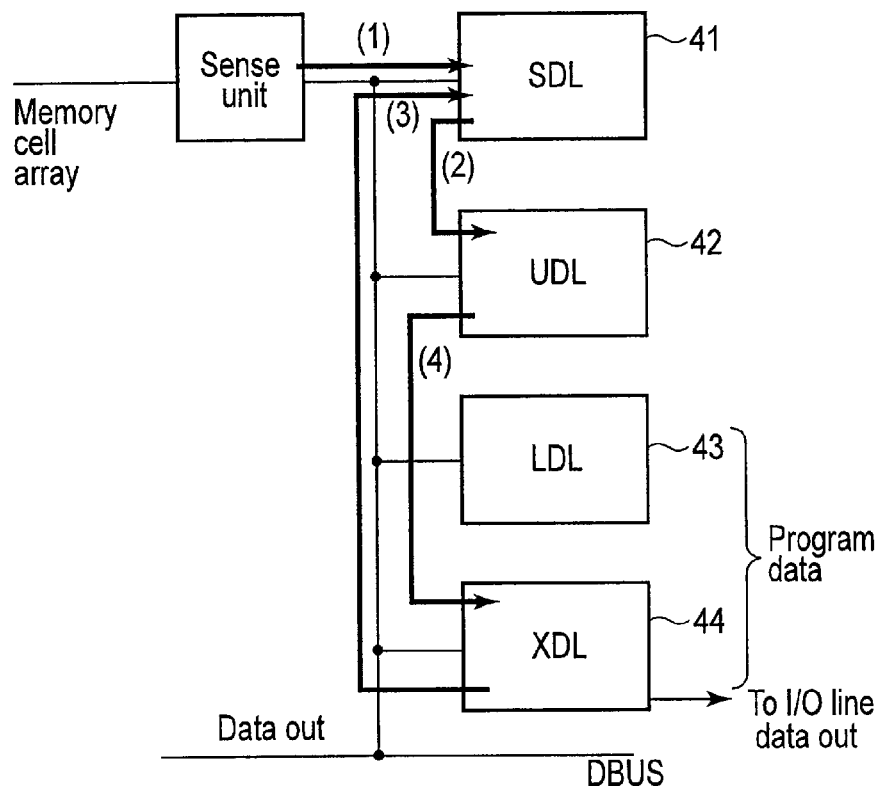
F I G. 5B

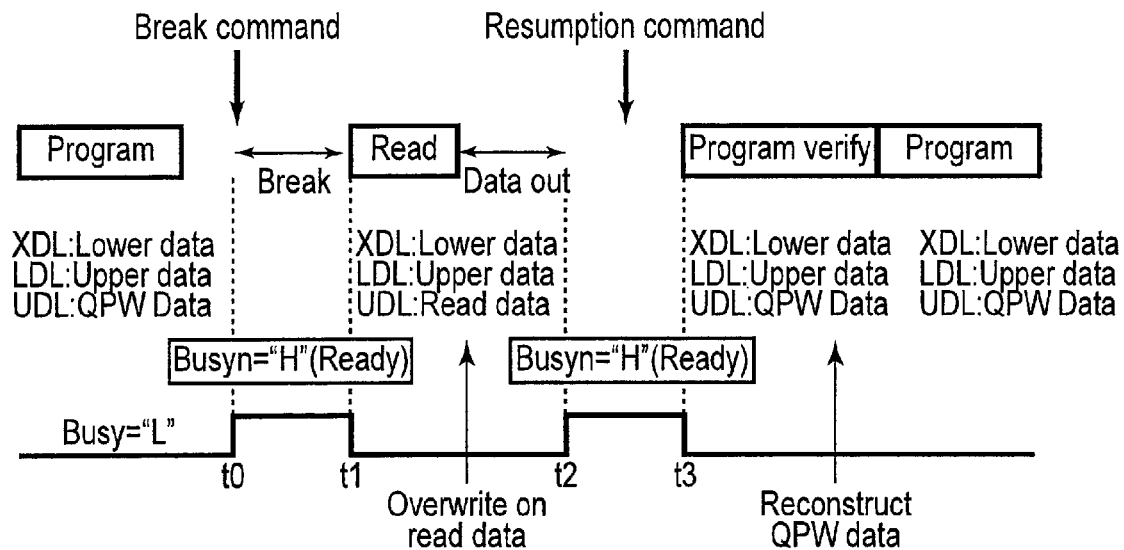
F I G. 7A
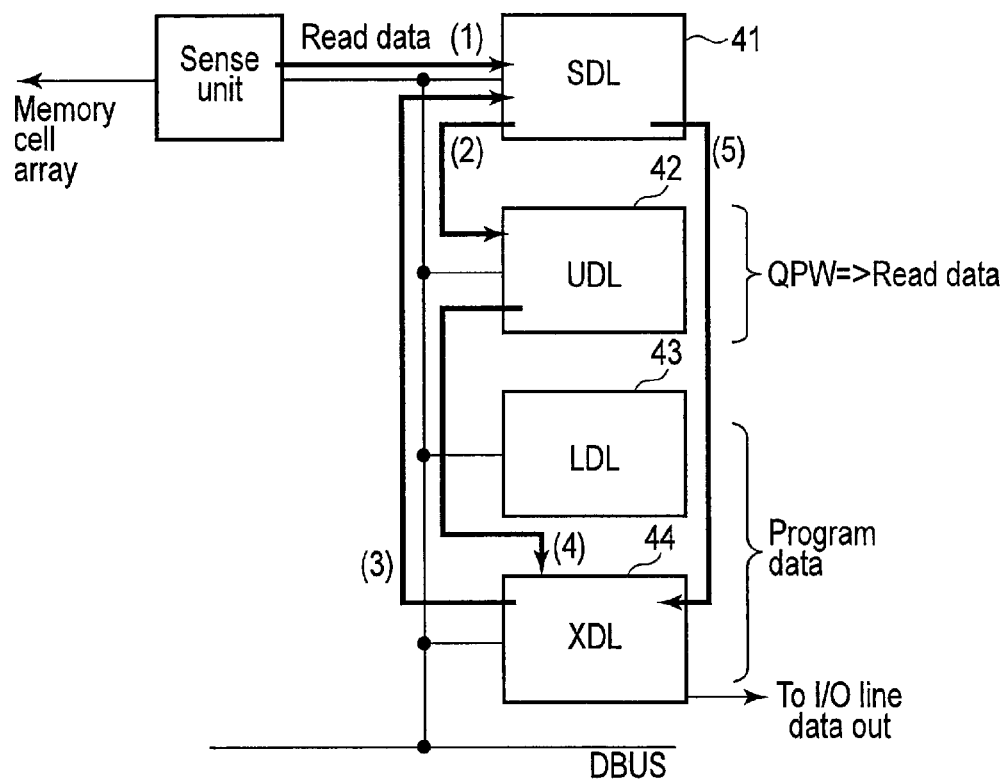
F I G. 7B

Step1: PDC=>CDG

Step2: SDC=>PDC

Step3: CDG=>TDC PDC=>CDG TDC=>PDC

Step4: Read=>SDC

Step5: CDG=>SDC

NONVOLATILE SEMICONDUCTOR MEMORY DEVICE

CROSS-REFERENCE TO RELATED APPLICATIONS

This application is a Continuation Application of PCT Application No. PCT/JP2013/075382, filed Sep. 12, 2013 and based upon and claims the benefit of priority from the prior Japanese Patent Application No. 2013-062125, filed Mar. 25, 2013, the entire contents of which are incorporated herein by reference.

FIELD

Embodiments relate to a nonvolatile semiconductor memory device, memory controller, and memory system.

BACKGROUND

A NAND flash memory includes a plurality of memory cells arranged in a matrix, and a sense amplifier capable of holding write data to these memory cells.

BRIEF DESCRIPTION OF THE DRAWING

FIG. 1 is an overall arrangement of a nonvolatile semiconductor memory device according to the first embodiment;

FIG. 2 is a conceptual view of a memory cell array according to the first embodiment;

FIG. 3 is an example of the circuit arrangement of a sense amplifier according to the first embodiment;

FIGS. 4A and 4B show an operation according to the first embodiment in which FIG. 4A is a flowchart when an interrupt command and a resumption command have been received, and FIG. 4B is a conceptual view of a write voltage when an interrupt command and a resumption command have been received;

FIGS. 5A and 5B show the operation of a memory system according to the first embodiment in which FIG. 5A is a sequence of commands issued by a memory controller, and FIG. 5B is a conceptual view showing data saving;

FIGS. 6A and 6B show the operation of a memory system according to a modification of the first embodiment in which FIG. 6A is a sequence of commands issued by a memory controller, and FIG. 6B is a conceptual view showing data saving;

FIGS. 7A and 7B show the operation of a memory system according to the second embodiment in which FIG. 7A is a sequence of commands issued by a memory controller, and FIG. 7B is a conceptual view showing data saving;

FIGS. 10A and 10B show the nonvolatile semiconductor memory device according to the third embodiment in which FIG. 10A is a circuit diagram showing an example of the arrangement of a sense amplifier, and FIG. 10B is a conceptual view showing data saving.

DETAILED DESCRIPTION

First Embodiment

Figure 6A:
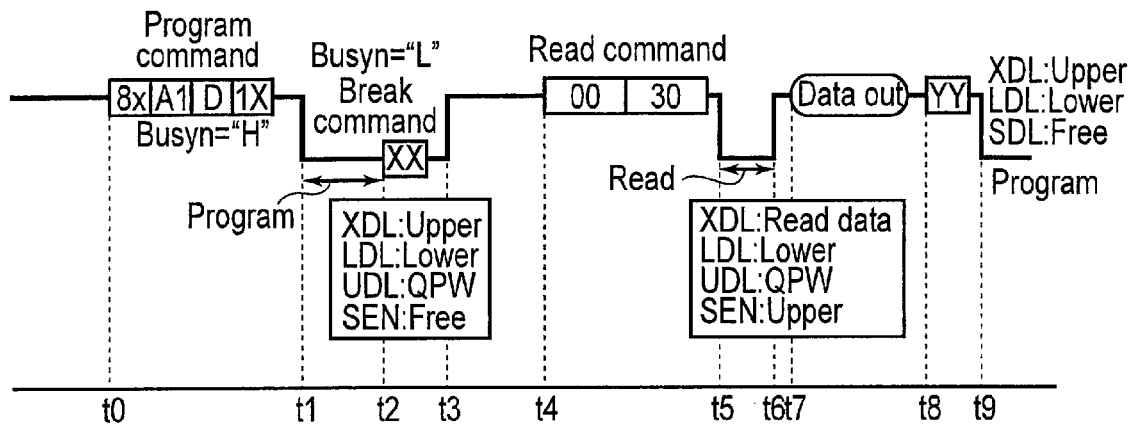

In general, according to one embodiment, a semiconductor memory device includes a memory cell array, a sense amplifier, a register, a controller. The memory cell array includes a memory cell. The memory cell electrically connects to a bit line. The sense amplifier electrically connects to the bit line. When a write operation is interrupted, the register configured to be capable of holding a write data and a write voltage at the time of interrupt. The controller configured to output a first signal representing that the write operation is progressing, and to receive a first command to interrupt the write operation and a second command to request a read operation during program operation, and when the read operation has ended, to receive a third command to request resumption of the write operation. The controller causes the register to hold the write data and the write voltage upon receiving the first command, and resumes the write operation based on the write data and the write voltage held in the register upon receiving the resumption command.

In the first embodiment, upon receiving an interrupt command from the outside during busy (Busyn="L", for example, write operation), the write operation is interrupted, and an externally received read operation is performed. After that, upon receiving a resumption command, the write operation is executed again from the point of interrupt. Note that "n" of Busyn indicates negative logic.

At this time, the read operation is executed even if the cache in the sense amplifier is not released.

1. Example of Overall Arrangement

FIG. 1 is a block diagram showing the arrangement of a memory system according to the first embodiment. The memory system includes a semiconductor device 1 and a host device 2. The semiconductor device 1 is connectable to the host device 2, and operates under the control of the host device 2.

The semiconductor device 1 also includes a nonvolatile semiconductor memory device 10, and a memory controller 20 (controller) that controls the nonvolatile semiconductor memory device 10. Examples of the semiconductor device 1 are an SD™ card and an SSD.

In this embodiment, a NAND flash memory will be exemplified below as the nonvolatile semiconductor memory device 10.

1. <Semiconductor Apparatus 1>
1.1 <Nonvolatile Semiconductor Memory Device 10>

The nonvolatile semiconductor memory device 10 includes a memory cell array 120 (memory cell array in FIG. 1), a row decoder 130 (R/D in FIG. 1), a sense amplifier 140 (sense amp in FIG. 1), a controller 150 (controller in FIG. 1), a voltage generator 160 (voltage generator in FIG. 1), and a register 170 (resister in FIG. 1).

1.1 <Example of Arrangement of Memory Cell Array 120>

As shown in FIG. 2, the memory cell array 120 includes blocks BLK0 to BLKs (s is a natural number) each including a plurality of nonvolatile memory cells MC. Each of the blocks BLK0 to BLKs includes a plurality of NAND strings 11 in which the nonvolatile memory cells MC are connected in series. Each of the NAND strings 11 includes, for example, 64 memory cells MC, and select transistors ST1 and ST2.

Each memory cell MC may hold data of two or more values. The memory cell MC has an FG structure including a floating gate (charge conductive layer) formed on a gate insulating film on a p-type semiconductor substrate, and a control gate formed on an inter-gate insulating film on the floating gate. Note that the memory cell MC may have a MONOS structure. The MONOS structure includes a charge accumulation layer (for example, insulating film) formed on a gate insulating film on a semiconductor substrate, an insulating film (to be referred to as a block layer hereinafter) formed on the charge accumulation layer and having a dielectric constant higher than that of the charge accumulation layer, and a control gate formed on the block layer.

The control gate of the memory cell MC is electrically connected to a word line, the drain is electrically connected to a bit line, and the source is electrically connected to a source line. The memory cell is an n-channel MOS transistor. The number of memory cells MC is not limited to 64 and may be 128, 256, or 512, and the number is not limited. The memory cells MC adjacent to each other share the source and the drain. The memory cells MC are arranged so that the current path is connected in series between the select transistors ST1 and ST2. The drain region on one end side of the memory cells MC connected in series is connected to the source region of the select transistor ST1. The source region on the other end side is connected to the drain region of the select transistor ST2.

The control gates of the memory cells MC on the same row are commonly connected to one of word lines WL0 to WL63. The gate electrodes of the select transistors ST1 and ST2 on the same row are commonly connected select gate lines SGD1 and SGS1, respectively. Note that for the sake of simplicity, if the word lines WL0 to WL63 need not be discriminated, they will sometimes simply be referred to as the word lines WL hereinafter. The drains of the select transistors ST1 on the same column in the memory cell array 120 are commonly connected to one of bit lines BL0 to BLn (n is a natural number). As for the bit lines BL0 to BLn as well, they will altogether be referred to as the bit lines BL hereinafter if they need not be discriminated. The sources of the select transistors ST2 are commonly connected to an source line SL.

Data are written at once in the plurality of memory cells MC connected to the same word line WL. This unit will be referred to as a page. The data of the plurality of memory cells MC are erased at once in each block BLK.

Note that each memory cell MC may hold any one of the data of, for example, four values. The four values are "E" level, "A" level, "B" level, and "C" level in ascending order of voltage. The "E" level is called an erase state and indicates a state in which no charges exist in the charge accumulation layer. As the charges are accumulated in the charge accumulation layer, the voltage rises from "A" level to "B" level and then to "C" level.

The memory cell MC in the erase state corresponds to "11" data. The memory cell MC whose threshold distribution is "A" level corresponds to "10" data. The memory cell MC whose threshold distribution is "B" level corresponds to "00" data. The memory cell MC whose threshold distribution is "C" level corresponds to "01" data.

When the held data is represented by "□Δ", "□" is called an upper bit that is stored in the fourth latch to be described later at the time of data write, and "Δ" is called a lower bit that is stored in the third latch to be described later at the time of write.

The memory cell array 120 need not always have the above-described arrangement, and may have an arrangement described in, for example, U.S. patent application Ser. No. 12/407,403 "Three Dimensional Stacked Nonvolatile Semiconductor Memory" filed Mar. 19, 2009. Alternatively, the memory cell array 120 may have an arrangement described in U.S. patent application Ser. No. 12/406,524 "Three Dimensional Stacked Nonvolatile Semiconductor Memory" filed Mar. 18, 2009, U.S. patent application Ser. No. 12/679, 991 "Non-Volatile Semiconductor Storage Device And Method of Manufacturing The Same" filed Mar. 25, 2010, or U.S. patent application Ser. No. 12/532,030 "Semiconductor Memory And Method for Manufacturing Same" filed Mar. 23, 2009. These patent applications are incorporated in this specification by reference in their entirety.

1.2 <Arrangement of Peripheral Circuits>

The row decoder 130 is connected to the plurality of word lines WL, and selects and drives the word lines WL at the time of data read, write, and erase.

The sense amplifier 140 is connected to the plurality of bit lines BL, and controls the BL voltage of the bit lines at the time of data read, write, and erase. The sense amplifier 140 also senses, for example, the potential of the bit line BL at the time of data read. Note that the sense amplifier 140 need not always sense the potential and may sense, for example, a cell current.

The sense amplifier 140 also applies a voltage corresponding to write data to the bit line BL at the time of data write. Note that the detailed arrangement of the sense amplifier 140 will be described later.

The controller 150 generates a control signal to control the sequence of data write, read, and erase based on a command CMD (interrupt command, resumption command, or the like to be described later) and an external control signal supplied from the memory controller 20 in accordance with the operation mode. This control signal is sent to the row decoder 130, the sense amplifier 140, the voltage guarantor 160, and the like.

In this embodiment, upon receiving an interrupt command from the memory controller 20, the controller 150 interrupts the write operation even if the operation is progressing, and then handles an interrupt of an externally received read operation. After that, upon receiving a resumption command from the memory controller 20, the controller 150 executes the write operation from the point of interrupt.

More specifically, when resuming the write operation, the controller 150 refers to the register 170 to be described later, and causes the voltage guarantor 160 to generate the next write voltage to be transferred to the word line WL in accordance with the data held in the register 170.

Note that the interrupt command in the first embodiment is, for example, an FF command. That is, the command is a special command that enables reception of the interrupt command even when the nonvolatile semiconductor memory device 10 is outputting a busy signal of "L" level.

The voltage guarantor 160 generates a read voltage (Vread, VCGR), a write voltage (VPGM), a verify voltage (V_AR, V_BR, or V_CR), and voltages necessary for various kinds of operations of the memory cell array 120, the row decoder 130, and the sense amplifier 140 in accordance with various kinds of control signals sent from the controller 150.

The register 170 exchanges various data with the memory controller 20 or the sense amplifier 140 (more specifically, via the fourth latch). More specifically, read data, write data, and the like are exchanged.

In addition, the register 170 holds information of the write voltage to be transferred to the word line WL next, the write count to the same memory cell MC, write data at the time of interrupt of the write operation, and the status (threshold distribution) to which the memory cell MC has transited at the time of interrupt of the write operation. The write voltage, write count, write data, and status are information to be referred to by the controller 150 or the memory controller 20. In the following embodiment, the controller 150 refers to the information.

2. <Example of Arrangement of Sense Amplifier 140>

The arrangement of the sense amplifier will be described next with reference to FIG. 3. The sense amplifier 140 includes a sense unit SU, a first latch circuit 41 (to be referred to as an SDL hereinafter), a second latch circuit 42 (to be referred to as a UDL hereinafter), a third latch circuit 43 (to be referred to as an LDL hereinafter), and a fourth latch circuit 44 (to be referred to as an XDL hereinafter). The sense unit SU includes a fifth latch circuit 45 (to be referred to as an SEN hereinafter).

The sense unit SU reads out data from the memory cell MC and transfers it to the SDL. The sense unit SU also transfers a write enable voltage (for example, 0 V) or a non-write voltage (for example, VDD) to the bit line BL in accordance with data stored in the XDL and the LDL.

The SDL holds the data read by the sense unit SU. The controller 150 transfers this data from the SDL to the XDL and then transfers it to the register 170 via an I/O (not shown).

The UDL holds data for quick path write (to be referred to as QPW hereinafter). That is, the UDL holds information representing whether the threshold voltage of the memory cell MC has exceeded a certain verify voltage.

Note that QPW is a data write method used to obtain a fine threshold distribution of the memory cell MC. QPW is described in, for example, U.S. patent application Ser. No. 10/051,372 "Non-Volatile Semiconductor Memory Device" filed Jan. 22, 2002. This patent application is incorporated in this specification by reference in its entirety.

A threshold distribution is obtained by performing verify using a voltage lower than the target threshold voltage and selectively performing write to the memory cell MC with a threshold transition smaller than normal.

The threshold voltage is lower than the verify voltage, the UDL holds, for example, "0" data. At the time of write, the bit line BL is clamped to a predetermined voltage (>0 V).

Note that in the first embodiment, since the write method using QPW is not performed, the UDL may be eliminated. Note that the write using QPW will be explained in a modification.

As described above, the LDL holds lower data out of write data formed from 2 bits. More specifically, the LDL holds one of "0" and "1" data.

As described above, the XDL holds upper data out of write data formed from 2 bits. More specifically, the XDL holds one of "0" and "1" data.

The data in the LDL and the XDL are combined, thereby writing desired data ("11", "10", "00", or "01") in the memory cell MC.

The SEN temporarily holds read data and transfers it to the SDL. The SEN is usable not only for the read data but also for the operation among the data latches.

2. <Memory Controller 20>

Referring back to FIG. 1, the memory controller 20 will be described. The memory controller 20 receives an instruction from the host device 2, and controls the nonvolatile semiconductor memory device 10 based on the instruction.

In the first embodiment, for example, if a data read request is received from the host device 2 during the write operation, the memory controller 20 issues an interrupt command to the nonvolatile semiconductor memory device 10 during the data write and then issues a read command.

When the read operation has ended, the memory controller 20 issues a resumption command to resume the interrupted write.

When the memory controller 20 issues the interrupt command to the nonvolatile semiconductor memory device 10, the nonvolatile semiconductor memory device 10 executes the following operation.

3. <Operation of Nonvolatile Semiconductor Memory Apparatus 10>

The operation of the nonvolatile semiconductor memory device 10 according to the first embodiment will be described next with reference to FIGS. 4A and 4B. FIG. 4A is a flowchart showing the operation of the nonvolatile semiconductor memory device 10. FIG. 4B shows the write voltage and the busy signal (Busyn in FIG. 4) transferred to the word line WL and is a conceptual view showing a state in which write is interrupted based on the interrupt command and resumed.

3.1 <Flowchart>

As shown in FIG. 4A, first, the write operation to the memory cell MC is executed (step S0). The write operation is executed by transferring a write voltage to the word line WL while transferring a write enable voltage or a non-write voltage to the bit line BL.

As shown in FIG. 4B, the write voltage transferred to the word line WL rises stepwise as the write count increases. This aims at raising the threshold voltage of the memory cell MC up to the target voltage.

When the memory controller 20 issues the interrupt command in the middle of step S0 (YES in step S1), the controller 150 interrupts the write operation and issues a busy signal (indicating the Ready state) of "H" level to the memory controller 20 (step S2, FIG. 4B).

This will be described in detail. After the write operation has been ended up to a predetermined step as shown in FIG. 4B, the controller 150 switches the busy signal to the Ready state (Busyn="H" level). In FIG. 4B, for example, a voltage V4 is transferred to the selected word line WL, and after that, the write operation is interrupted.

Additionally, since the state is the Ready state, as shown in FIG. 4B, a read command is received from the memory controller 20 after that (step S3).

Upon receiving the read command, the controller 150 issues the busy signal of "L" level to the memory controller 20 and starts the read operation (step S4, FIG. 4B).

In the read operation, the read data is temporarily stored in the SDL and then transferred to the register 170 via the fourth latch circuit 44, as described above (step S5).

After that, upon receiving the resumption command from the memory controller 20 (step S6), the controller 150 refers to the register 170 and resumes the write operation from a predetermined voltage, as shown in FIG. 4B (step S7).

4. <Command Sequence and Data Transfer of Sense Amplifier 140>

FIGS. 5A and 5B are conceptual time-serially showing the sequence of commands transferred from the memory controller 20 and the data stored state in the sense amplifier 140 at the time of the read operation.

As shown in FIG. 5A, when a write command ("8×A1 D 1×") is issued at time t0, the nonvolatile semiconductor memory device 10 executes the write operation based on this command (times t1 to t2 in FIG. 5A). At this time, the controller 150 issues the busy signal of "L" level to the memory controller 20. Note that "8×1×" indicates the write command, "A1" indicates the address of the memory cell MC of the write target, and "D" indicates the write data.

After that, at time t2, when the memory controller 20 issues the interrupt command ("XX" in FIG. 5A), the controller 150 interrupts the write operation up to that time and changes the busy signal to "H" level at time t3.

At time t4, the read command ("00 30" in FIG. 5A) is issued. Then, the controller 150 outputs the busy signal of "L" level to the memory controller 20 and executes the read operation during the period of times t5 to t6.

In the read operation, inter-latch data transfer to be described below is executed to output the read data to the register 170.

As shown in FIG. 5B, after the read data is temporarily stored in the SDL (represented by (1) in FIG. 5B), the read data is transferred from the SDL to the UDL.

After that, since the SDL is a free space, the upper bit stored in the XDL is transferred to the SDL. Then, the read data stored in the UDL is output to the register 170 via the XDL. The read data is sequentially transferred to the register 170 via the I/O.

Data transfer to the sense amplifier 140 has been described above. However, the step of data transfer is not limited to this. In brief, focusing on the fact that the UDL has a free space, a step of transferring (1) write data from the XDL to the UDL and then transferring the read data from the SDL to the XDL may be employed. Hence, the step of data transfer is not limited to that described above.

Note that at this time, the data (lower bit) necessary for the write is stored in the LDL without being moved, as shown in FIGS. 5A and 5B.

The data transfer is controlled by the controller 150.

After that, when the memory controller 20 issues the resumption command ("YY" in FIG. 5A) at time t8, the controller 150 that has received it issues the busy signal of "L" level and resumes the write operation.

Effect According to First Embodiment

The memory system according to the first embodiment may obtain an effect (1).

(1) Throughput of Read Operation May be Improved

That is, in this embodiment, the memory controller 20 issues the interrupt command and the resumption command. Upon receiving the interrupt command, the nonvolatile semiconductor memory device 10 may interrupt the write operation and handle an interrupt of, for example, the read operation.

In general, data write requires a time of several ms. That is, when executing the read operation, the data is read after waiting for several ms. In this case, the operation speed of the memory system cannot be increased as a whole.

If the memory controller 20 simply issues the read command during the write operation, the write to the memory cell MC cannot be completed, and data written in the page direction (described with reference to FIG. 2) at once may be destroyed.

This phenomenon will be described in detail. If the read operation intervenes in the middle of the rise of the voltage V4 as shown in, for example, FIG. 4B in accordance with the data in the XDL and the LDL, the read data is stored in the XDL via the I/O line. That is, the read data is overwritten on the write data up to that time. The data may be destroyed in this way.

In this case, it is necessary to switch the page and execute the write operation anew. However, the memory controller 20 does not necessarily issue the resumption command to the nonvolatile semiconductor memory device 10. That is, from the viewpoint of the memory controller 20, the request of the memory controller 20 is met when the data is read. Hence, the interrupted write command is not always issued by the memory controller 20.

However, the memory system according to this embodiment includes both the interrupt command and the resumption command.

The interrupt command according to this embodiment has a function of causing the nonvolatile semiconductor memory device 10 to end the write operation up to certain step and output the read data to the register 170 without destroying the write data. It is therefore possible to obviate the necessity of waiting until the end of the write operation, as described above, and issue the interrupt command any time.

For this reason, the wait time from issuance of the read request by the memory controller 20 to the start of the read operation may be as short as several hundred µs. This increases the read throughput as compared to the above-described arrangement.

In addition, the register 170 in the nonvolatile semiconductor memory device 10 holds information immediately before the interrupt. Hence, even when the resumption command is received, the write voltage may be transferred to the word line WL from the point of interrupt.

As described above, in the memory system according to the first embodiment, data may be read without waiting for the completion of the write operation even in the middle of the write operation.

<Modification>

A memory system according to a modification (to be referred to as a first modification hereinafter) of the first embodiment will be described next.

In the first modification, a technique of the read operation in a state in which the QPW information is held in the UDL will be explained. In this case, data are stored in all of the latch circuits, that is, the SDL, UDL, LDL, and XDL. Hence, the SEN in the sense unit SU needs to be used for the operation among the data latches.

Figure 6B:
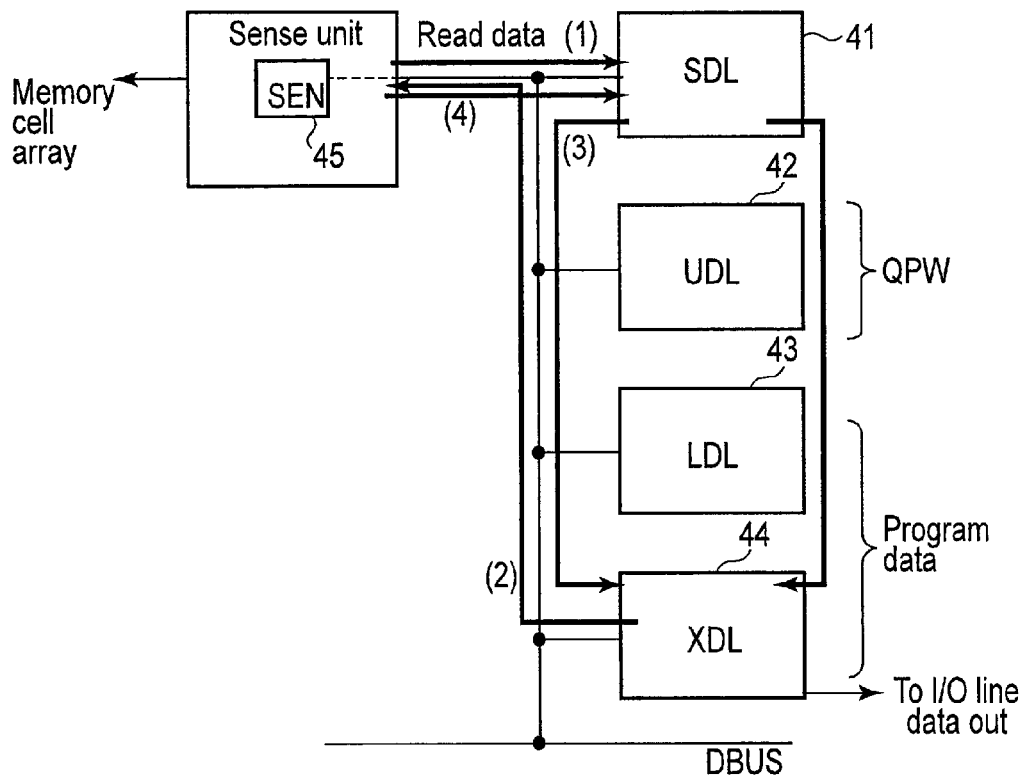

FIGS. 6A and 6B are conceptual views showing the command sequence and data transfer in the sense amplifier 140. Note that a description of the same operation as in the first embodiment will be omitted.

As shown in FIG. 6A, when the memory controller 20 issues the interrupt command, the upper bit, lower bit, and QPW information have been stored in the XDL, LDL, and UDL in the sense amplifier 140.

After that, when the read operation from time t7 is executed, the read data is stored in the SDL and finally transferred to the register 170 via the XDL. Data transferring to the sense amplifier 140 will be described with reference to FIG. 6B.

Note that the write data and QPW data stored in the UDL and the LDL are not stored in the sense amplifier 140. This is because there is no need to stored the data in the UDL and the LDL to one of the latch portions from the viewpoint of transferring the read data to the register 170 via the XDL. That is, the data that needs to be stored is the upper bit stored in the XDL.

As shown in FIG. 6B, the read data is transferred from the sense unit SU to the SDL (1). The data in the SDL needs to be transferred to the register 170 via the XDL. To do this, the data in the XDL is transferred to the SEN (2).

Since the XDL is a free space, the data is transferred from the SDL to the XDL (3).

Since the SDL is a free space, the upper data stored in the SEN in (2) is transferred to the SDL (5). After the read data stored in the XDL is transferred to the register 170, the upper data is returned from the SDL to the XDL.

Effect According to First Modification

Even the memory system according to the first modification may obtain the effect (1). That is, even if the necessary data are stored in all latch circuits, the read data may be transferred to the register 170 using the SEN for the operation among the data latches. For this reason, even when the write command is issued by the memory controller 20, the operation may quickly transit to the read operation.

Second Embodiment

A memory system according to the second embodiment will be described with reference to FIGS. 7A and 7B. The second embodiment is different from the above-described embodiment in that read data is overwritten on QPW data stored in a UDL. That is, the UDL is used in the second embodiment, although the SEN is used in the modification. Instead, QPW data stored in the UDL till then needs to be restored after the read operation. This will also be explained.

1. <Sequence and Data Transfer>

FIGS. 7A and 7B are conceptual views showing the command sequence and data transfer to a sense amplifier 140. Note that a description of the same sequence as in the first embodiment will be omitted.

When the read operation is performed at time t1, a controller 150 transfers read data to the UDL in which the QPW data is stored. More specifically, the read data is temporarily stored in an SDL and then transferred to the UDL. Note that in this case as well, an XDL and an LDL keep holding the upper bit and the lower bit, respectively.

After that, the read data stored in the UDL by the controller 150 is transferred to a register 170 via the XDL.

This process will be described with reference to FIG. 7B. As shown in FIG. 7B, the data read by a sense unit SU is stored in the SDL by the controller 150 (1) and then transferred to the UDL (2). The verify result for the interrupted write operation disappears here.

Next, the controller 150 transfers the data in the XDL to the SDL having a free space (3). Since this makes it possible to store the read data in the XDL, the controller 150 transfers the data in the UDL to the XDL (4) and further transfers it to the register 170 (represented by Data Out in FIG. 7B).

After the end of the read, the controller 150 transfers the data in the SDL to the XDL so that the upper bit is stored in the XDL (5).

The controller 150 stores the QPW data in the UDL. A QPW data restore method will be described with reference to FIG. 8.

2. <QPW Data Reconstruction Method>

Information held in the register 170 will be described first.

2.1 <Information Held in Register 170>

Figure 8:
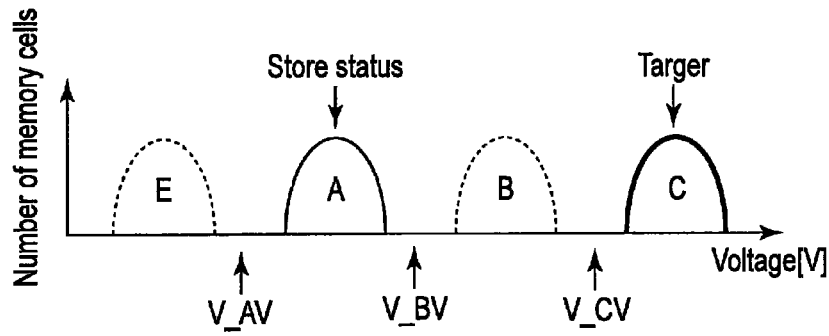
FIG. 8 is a conceptual view of information held in a register according to the second embodiment.

FIG. 8 shows information held in the register 170. FIG. 8 shows the threshold distribution of a memory cell MC and information stored in the register 170. That is, when the write operation is interrupted, the register 170 stores the status written in the memory cell MC.

FIG. 8 indicates that, for example, a status A is written in the memory cell MC. Note that the target threshold is "C" level.

2.2 <Flowchart (Restore Method)>

Figure 9:
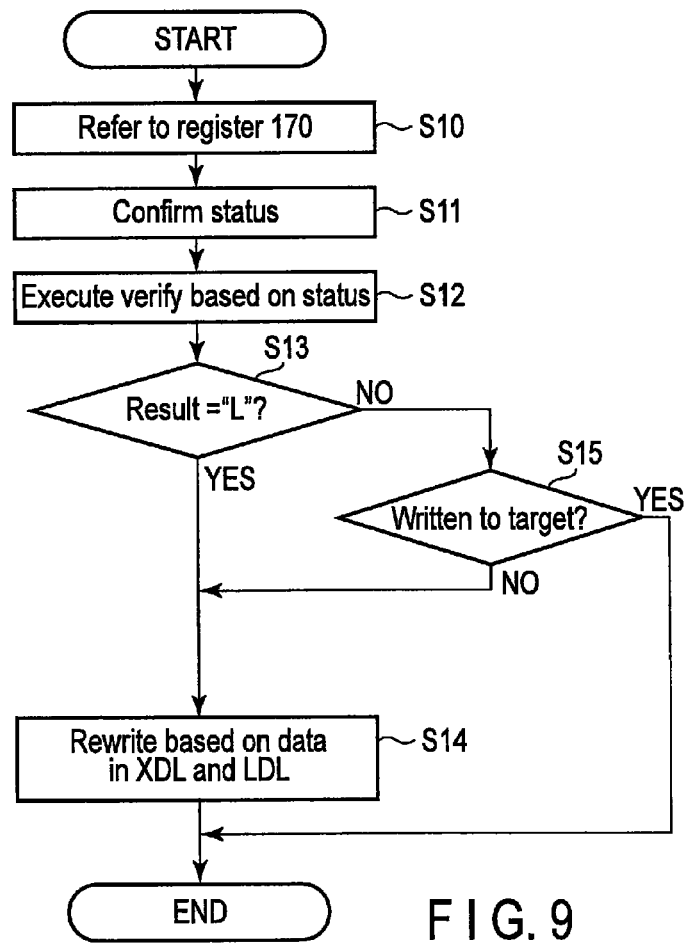
FIG. 9 is a flowchart showing the operation of a nonvolatile semiconductor memory device according to the third embodiment.

The operation of the QPW restore method will be described with reference to the flowchart of FIG. 9.

When the write operation is resumed, the controller 150 refers to the register 170 (step S10). The controller 150 then confirms the status of the memory cell MC stored in the register 170 (step S11).

The controller 150 executes a verify operation based on the status (step S12). More specifically, as shown in FIG. 8, the verify point is raised from a voltage V_AV to a voltage V_BV and to voltage V_CV, and it is checked whether a NAND string 11 flows current.

If the verify result is "L" level (YES in step S13), it is determined that transition up to the desired threshold distribution is not completed yet. The controller 150 executes rewrite based on the data stored in the XDL and the LDL (step S14). That is, the QPW data in the UDL is restored at this point of time.

If the verify result is "H" level in step S13 (NO in step S13), the controller 150 confirms whether transition up to the target threshold distribution is completed. That is, if the XDL and the LDL hold a data combination other than "1" and "1" (NO in step S15), the controller 150 determines that the target threshold distribution has not been reached yet, and executes the operation in step S14.

Effect According to Second Embodiment

As described above, when the register 170 is caused to hold, as information, the threshold distribution of the memory cell MC before the interrupt, the QPW data that has been erased may be restored. This is because the register 170 grasps the threshold distribution (status) of the memory cell MC immediately before the interrupt. That is, when the status information and write data are held, as in the second embodiment, the QPW data may be restored.

In addition, even the memory system according to the second embodiment may obtain the effect (1).

Third Embodiment

A memory system according to the third embodiment will be described next with reference to FIGS. 10A and 10B. The third embodiment is different from the above-described embodiments in that a sense amplifier 140 alternately reads data of odd- and even-numbered bit lines BL or alternately executes data write. The arrangement of the sense amplifier 140 will be described below. Note that the same reference numerals denote the same components.

1. <Example of Arrangement of Sense Amplifier 140>

Figures 10A, 10B:
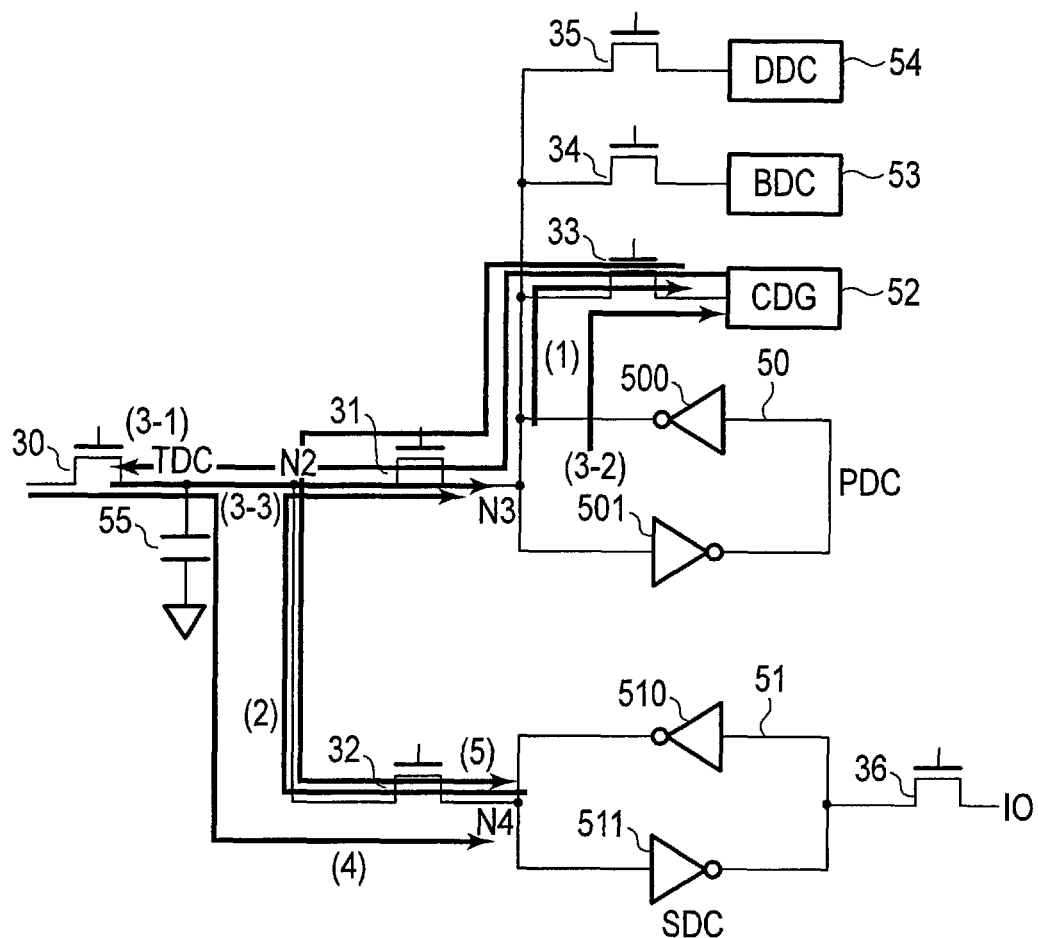

FIG. 10A is a conceptual view showing the arrangement of the sense amplifier 140 and the step of data transferring. The arrangement of the sense amplifier 140 will be described here.

As shown in FIG. 10A, the sense amplifier 140 according to the third embodiment includes n-channel MOS transistors 30 to 36, latch circuits 50 to 54, and a capacitor element 55. Note that a latch circuit 50 (to be referred to as a PDC hereinafter) is formed from inverters 500 and 501, and a latch circuit 51 (to be referred to as an SDC hereinafter) is formed from inverters 510 and 511.

The arrangement of the sense amplifier 140 will be described below. Note that signals supplied to the gate of the MOS transistors are not illustrated.

One end of the current path of the MOS transistor 30 is connected to a bit line BL, and the other end is connected to a node N2. The node N2 will be referred to as a TDC hereinafter.

One electrode of the capacitor element 55 is connected to a node N2, and the other electrode is grounded.

One end of the current path of the MOS transistor 31 is connected to the node N2, and the other end is connected to a node N3. The PDC is connected to the node N3. More specifically, both the output terminal of the inverter 501 and the input terminal of the inverter 500 are connected to the node N3.

One end of the current path of the MOS transistor 32 is connected to the node N2, and the other end is connected to the SDC at a node N4. More specifically, the other terminal of the MOS transistor 32 is connected to the output terminal of the inverter 510 and the input terminal of the inverter 511 at the node N4.

The output terminal of the inverter 510 and the input terminal of the inverter 511 are connected to one end of the current path of the MOS transistor 36 via a node N4. Note that the other end of the current path of the MOS transistor 36 is connected to a register 170 via an I/O line.

One-end sides of the current paths of the MOS transistors 33 to 35 are connected to the node N3, and the other terminal sides of the MOS transistors are connected to the latch circuit 52 (to be referred to as a CDG hereinafter), the latch circuit 53 (to be referred to as a BDC hereinafter), and the latch circuit 54 (to be referred to as a DDC hereinafter), respectively.

In the above-described arrangement, the upper bit of write data is stored in the SDC, and the lower bit is stored in the PDC.

Data transferring among the latch circuits at the time of data read will be described below with reference to FIGS. 10A and 10B.

2. <Read Operation>

As described above, FIG. 10A is a conceptual view showing the arrangement of the sense amplifier 140 and the step of data transferring. FIG. 10B is a conceptual view showing the order of transfer of data stored in the latch circuits in FIG. 10A.

As shown in FIGS. 10A, and 10B, first, the lower bit stored in the PDC is transferred to the CDG (1). Since the PDC is a free space, the upper bit stored in the SDC is transferred to the PDC (2). The PDC is a latch circuit configured to exchange data with the register 170, and therefore needs to be temporarily released in this way.

After that, the lower bit stored in the CDG is transferred to the TDC, the upper bit stored in the PDC is transferred to the CDG, and the lower bit transferred to the TDC is stored in the original PDC (3).

Next, since the SDC is released, the read operation is executed. That is, read data is transferred to the SDC and then output to the register 170 via the SDC (4).

Finally, the upper bit saved in the CDG is stored in the original SDC (5).

The above-described steps (1) to (5) are performed, thereby executing the read operation while interrupting the write operation.

Effect According to Third Embodiment

Even the memory system according to the third embodiment may obtain the effect (1). That is, even if the data read method is different, when the interrupt command is issued, the write operation is interrupted, and the operation may immediately transit to the read operation.

Note that although in the above description, the memory controller issues the interrupt command and the resumption command, this function may be imparted to the host device 2.

The area where the register 170 is arranged is not limited to the area in the nonvolatile semiconductor memory device 10. That is, the register 170 may be arranged in the memory controller 20 or the host device 2.

In, for example, FIG. 5A, the nonvolatile semiconductor memory device 10 meets the request of the read command from the memory controller 20 a plurality of number of times until the resumption command (YY) is received from the memory controller 20. That is, the nonvolatile semiconductor memory device 10 may perform the read operation any number of times.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array including a memory cell;
a sense amplifier electrically connected to the memory cell;
a register configured, when a write operation is interrupted, to be capable of holding information including write data, a write voltage, and a threshold distribution of the memory cell at the time of interruption; and
a controller configured to output a busy signal representing that the write operation is progressing, and to be capable of receiving a resumption command to request resumption of the write operation after an interruption command to interrupt the write operation has been received while the busy signal is output,
wherein the controller causes the register to hold the information upon reception of the interruption command, and resumes the write operation based on the information held in the register upon reception of the resumption command, the write voltage of the write operation immediately after resumption being higher than the write voltage of the write operation before interruption.

2. The device of claim 1, wherein the sense amplifier comprises a first latch, a second latch configured to be capable of holding an upper bit of the write data, a third latch configured to be capable of holding a lower bit of the write data, and a fourth latch configured to be capable of holding a verify result indicating whether or not to complete the write operation, and
the sense amplifier is capable of transferring the upper bit, the lower bit, and the verify result to the register.

3. The device of claim 1, wherein the controller resumes the write operation only if the resumption command is received, once the interruption command to interrupt the write operation has been received.

4. The device of claim 1, wherein the information includes the number of write operations before interruption.

5. The device of claim 2, wherein upon reception of the resumption command,
the controller transfers a verify voltage to the memory cell while referring to the register and confirming the threshold distribution included in the information, and
the controller causes the memory cell to store data corresponding to ON or OFF in the fourth latch.

6. A nonvolatile semiconductor memory device comprising:
a memory cell array including a memory cell;
a controller configured to output a busy signal representing that a write operation is progressing, and to be capable of receiving a resumption command to request resumption of the write operation after an interruption command to interrupt the write operation has been received while the busy signal is output, wherein the controller resumes the write operation upon reception of the resumption command, a write voltage of the write operation immediately after resumption being higher than a write voltage of the write operation before interruption.

7. The device of claim 6 further comprising:

a register; and a sense amplifier electrically connected to the memory cell, wherein the sense amplifier comprises a first latch, a second latch configured to be capable of holding an upper bit of the write data, a third latch configured to be capable of holding a lower bit of the write data, and a fourth latch configured to be capable of holding a verify result indicating whether or not to complete the write operation, and the sense amplifier is capable of transferring the upper bit, the lower bit, and the verify result to the register.

8. The device of claim 6, wherein the controller resumes the write operation only if the resumption command is received, once the interruption command to interrupt the write operation has been received.

9. A nonvolatile semiconductor memory device comprising:

a word line connected to a memory cell array; and a controller configured to be capable of applying a voltage to the word line, perform a write operation upon reception of a write command, and output a busy signal representing that the write operation is progressing, wherein the write operation includes a first cycle, a second cycle, and a third cycle that are executed in the order given, the controller performs a first verify operation after applying a first voltage to the word line during the first cycle; performs a second verify operation after applying a second voltage to the word line during the second cycle; interrupts the write operation after completion of the second cycle if an interruption command is received during the second cycle; resumes the write operation if a resumption command is received after the interruption; and executes the third cycle immediately after the resumption; and applies a third voltage to the word line during the third cycle, and the second voltage is higher than the first voltage, and the third voltage is higher than the second voltage.

10. The device of claim 9, wherein the controller outputs a ready signal after the interruption, and outputs a busy signal after resumption of the write signal.

11. The device of claim 10, wherein the controller performs a read operation if a read command is received after the interruption, and is capable of receiving the resumption command after completion of the read operation.

12. The device of claim 11, wherein the controller outputs a busy signal during the read operation.

13. The device of claim 9, wherein the controller performs a fourth verify operation before executing the third cycle if the resumption command is received.

* * * * *